United States Patent [19]

Lee

[11] Patent Number: 5,687,101

[45] Date of Patent: Nov. 11, 1997

[54] DIGITAL FILTER CIRCUIT AND SIGNAL PROCESSING METHOD FOR THE SAME

[75] Inventor: Hyo-seung Lee, Seoul, Rep. of Korea

[73] Assignee: Samsung Electronics Co., Ltd., Kyungki-Do, Rep. of Korea

[21] Appl. No.: 471,688

[22] Filed: Jun. 6, 1995

[30] Foreign Application Priority Data

Jun. 23, 1994 [KR] Rep. of Korea .................. 94-14397
Apr. 14, 1995 [KR] Rep. of Korea .................. 95-8804

[51] Int. Cl.[6] .................................................. H03H 15/00
[52] U.S. Cl. ............... 364/572; 364/553; 364/724.03; 364/724.16; 364/724.17
[58] Field of Search .................................. 364/572, 574, 364/553, 724.03, 724.13, 724.16, 724.17, 724.19; 398/415, 607, 609, 610, 613, 611, 614; 358/340, 327, 336, 315, 166, 167; 375/346, 350; 381/71, 94

[56] References Cited

U.S. PATENT DOCUMENTS

| 4,698,680 | 10/1987 | Lewis, Jr. et al. | 358/166 |
| 5,224,170 | 6/1993 | Waite, Jr. | 364/724.19 |
| 5,331,416 | 7/1994 | Patel et al. | 348/614 |

Primary Examiner—Ellis B. Ramirez
Assistant Examiner—Hal V. Wachsman
Attorney, Agent, or Firm—Sughrue, Mion, Zinn, Macpeak and Seas

[57] ABSTRACT

In a digital IIR filter having a predetermined transfer function, a transfer function of an all-pass filter having the same amplitude as a first pole coefficient of the transfer function and the opposite sign is set. By synthesizing the transfer function and the transfer function of the set all-pass filter, a new transfer function, in which the first pole is eliminated, is calculated such that an input signal is processed by the new transfer function.

12 Claims, 12 Drawing Sheets

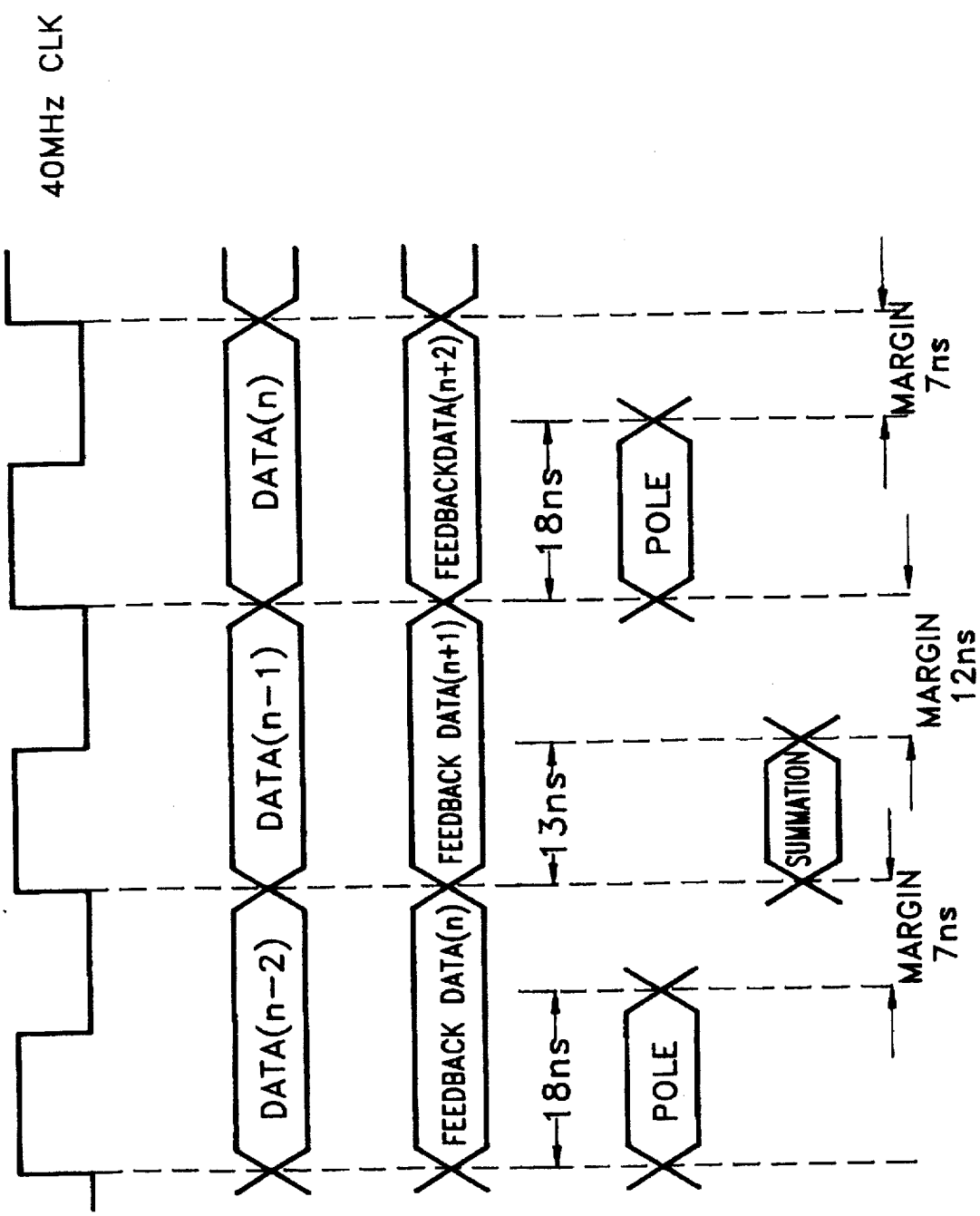

DIGITAL FILTER CIRCUIT AND SIGNAL PROCESSING METHOD FOR THE SAME

BACKGROUND OF THE INVENTION

The present invention relates to a digital filter circuit and a signal processing method for the digital filter circuit, and more particularly, to a digital filter circuit and a signal processing method for the digital circuit for speeding up the signal processing of a digital infinite impulse response (IIR) filter.

Generally, when the frequency of an image signal is modulated in a recording system and demodulated in a reproducing system, noise is introduced to the system in proportion to the frequency. This noise is called triangular noise and lowers the signal-to-noise (S/N) ratio of a reproduced image signal. To prevent such a problem, a high band component of the signal is boosted by a pre-emphasis circuit in the recording system. Then, the emphasized high-band component is de-emphasized during reproduction.

FIG. 1 is a circuit diagram showing a conventional analog main pre-emphasis circuit consisting of a capacitor C and resistors $R_a$ and $R_b$. In FIG. 1, when an input signal is a low-frequency component, an output signal of the voltage ratio of $Ra/(Ra+Rb)$, is generated. Whereas when the input signal is a high-frequency component, an output signal of the voltage ratio of $$\frac{1 + RbCS}{\frac{Rb}{Ra} + 1 + RbCS},$$

is output.

For counteracting any gain reduction experienced by the above-described signal processing, a gain stage A is added to the output signal by using amplifier 101. Here, $$A = \frac{Rb + Ra}{Ra}$$

The Laplacian transfer function (1) of the analog filter as shown in FIG. 1 is as follows.

$$H(S) = \frac{1 + RbCS}{\frac{Rb}{Ra} + 1 + RbCS} \left( \frac{Rb + Ra}{Ra} \right) \quad (1)$$

Here, S is a sampling rate. Further, given that $$Z_1 = C\|Rb$$
$$= \frac{Rb}{1 + RbCS}$$

and $Z_2 = Ra$ together with the above gain (A) formula, the transfer function of expression (1) can be shown as expression (2), and the block diagram embodying expression (2) is shown in FIG. 2.

$$H(S) = A \left( \frac{Z_2}{Z_1 + Z_2} \right) \quad (2)$$

Expression (2) is of a form in which an output signal passed through a high-pass filter is added to the original signal.

FIG. 3 shows an amplitude response characteristic of the transfer function of the circuit shown in FIG. 1, and as an input signal has a higher-frequency component, an output signal having a larger amplitude is output.

The analog filter having a transfer function such as expression (1) can be digitized by using an IIR filter.

FIG. 4 shows a circuit of a general digital IIR filter.

As shown in FIG. 4, the IIR filter uses feedback portion 312 unlike a finite impulse response (FIR) filter, and the number of delays 308, 310, etc., used in feedback portion 312, are determined by the structure of the filter.

The transfer function of the general IIR filter is shown in expression (3).

$$H_1(Z) = \frac{\sum_{i=0}^{M} a_i Z^{-i}}{1 + \sum_{i=1}^{N} b_i Z^{-i}} \quad (3)$$

Here, $b_i \neq 0$. In expression (3), the denominator signifies zero and the numerator signifies pole.

If the IIR filter has a first pole, only a single delay is used in the process of calculating the first pole and adding the calculated output. Due to the presence of first coefficient $b_1$, the first pole coefficient calculation and adding operation must be accomplished within one clock cycle in multiplier 309 and adder 307, and so the signal processing speed of a circuit is reduced. Namely, because the time corresponding to the one cycle of the clock for driving a digital filter circuit must be longer than the total time required for calculating a coefficient of the first pole plus the adding operation of the calculated coefficient.

A digital main pre-emphasis circuit using such an IIR filter is explained referring to FIGS. 5, 6, 7 and 8A–8D.

FIG. 5 is a circuit diagram of the circuit shown in FIG. 1 using an IIR filter. Here, the Z conversion transfer function can be expressed as in expression (4) in case that the transfer function has a first pole in expression (3).

$$H_2(Z) = \frac{A(a_0 + a_1 Z^{-1})}{1 + b_1 Z^{-1}} \quad (4)$$

The operation of the circuit shown in FIG. 5 is explained as follows.

Input signal In is input to adder 402 via amplifier 401 having gain $a_0$. Also, after being latched in latch 403, input signal In is input to adder 402 via amplifier 404 having gain $a_1$. Here, the waveform of input signal In is a multi-burst signal, such as 500 KHZ, 1 MHz, 2 MHz, 3 MHz, 3.58 MHz and 4.2 MHz shown in FIG. 6.

In adder 402, the outputs of amplifiers 401 and 404 are added, and the summed output is input to adder 405. The output of adder 405 is output via amplifier 408 having gain A with a high-frequency component being emphasized as shown in FIG. 7, and simultaneously, after being latched in latch 406, is fed back to adder 405 via amplifier 407 having gain $b_1$.

Here, feedback portion 409 reduces the signal processing speed of a circuit through first pole $b_1$ in expression (4). That is, when IIR filter has first pole $b_1$, by using only a single delay (latch 406), the process of multiplying the signal output from latch 406 by coefficient $b_1$ and the adding process in adder 405 must be performed during one clock cycle. That is, assuming a 25 MHz clock is used in FIGS. 8A–8D, one 40 ns clock cycle is composed of a pole coefficient calculating time of 18 ns, a calculated coefficient adding time of 15 ns, and a margin time of 7 ns.

Thus, for a stable operation, the maximum clock speed of a circuit should be longer than the time required to calculate first pole $b_1$; namely, the total of the time delayed by the multiply operation in amplifier 407 and the time delayed in gating by adder 405. Thus, the aforesaid condition becomes a speed limiting factor in embodying the hardware.

To solve the above problem, one of two undesirable alternatives can be used. That is, either the whole system should be made of ultra-high speed elements, whereby cost increases accordingly, or the sampling clock ratio must be lowered, which degrades performance.

SUMMARY OF THE INVENTION

To solve the above problems, it is an object of the present invention to provide a digital processing method of a digital filter circuit which operates at high speed, in which a first pole is eliminated by using an all-pass filter having, at the same time, the same amplitude as the first pole coefficient of a digital IIR filter and the opposite sign.

It is another object of the present invention to provide a digital filter circuit in a digital IIR filter, which lessens the degree of operation speed reduction for signal processing in a feedback loop without the change of input and output and can be embodied with simple hardware, by separating a coefficient calculating process and an adding process of the calculated coefficient both performed in a single clock cycle when calculating a first pole, and then processing each separated process in one clock cycle, respectively.

It is still another object of the present invention to provide a digital main pre-emphasis circuit and a signal processing method which lessens the degree of operation speed reduction for signal processing in a feedback loop without the change of input and output, by separating a coefficient calculating process and an adding process of the calculated coefficient both performed in a single clock cycle when calculating a first pole, and then processing each separated process in one clock cycle, respectively, using a digital IIR filter.

Accordingly, to achieve the first object, there is provided a signal processing method of a digital filter circuit having a predetermined transfer function, comprising the steps of: inputting a signal to a first filter circuit having a predetermined transfer function $H_{11}(Z)$; inputting an output signal of the first filter circuit to a second filter circuit having a transfer function $H_{12}(Z)$ which has the same amplitude as a first pole coefficient of the transfer function $H_{11}(Z)$ and the opposite sign; obtaining a transfer function $H_{13}(Z)$ from the transfer function $H_{11}(Z)$ of which the first pole is eliminated, by synthesizing the transfer functions $H_{11}(Z)$ and $H_{12}(Z)$; and obtaining the output signal of the second filter circuit through the transfer function $H_{13}(Z)$, wherein when $b_1 \neq 0$, the transfer functions are $$H_{11}(Z) = \frac{\sum_{i=0}^{M} a_i Z^{-i}}{1 + \sum_{i=1}^{N} b_i Z^{-i}}$$

$$H_{12}(Z) = \frac{1 - b_1 Z^{-1}}{1 - b_1 Z^{-1}}$$

$$H_{13}(Z) = \frac{a_0 + \sum_{i=1}^{M} a_i' Z^{-i}}{1 + \sum_{i=2}^{N} b_i' Z^{-i}}$$

where $a_0'=a_0$, $a_1'=a_1-a_0 b_1$, $a_2'=-a_1 b_1, \ldots$; and $b_1'=b_1-b_1=0$, $b_2'=b_2-b_1^2$, $b_3'=b_3-b_1 b_2, \ldots$.

To achieve the second object, there is provided a digital filter circuit comprising: first operating means for operating an input signal with a predetermined zero coefficient; a plurality of first delaying means for delaying the input signal for at least one clock cycle; a plurality of second operating means for operating each output signal of the plurality of the first delaying means with predetermined zero coefficients beyond a first zero coefficient corresponding to the delayed time; first synthesizing means for synthesizing the output signals of the first operating means and the plurality of second operating means; feedback means including a plurality of second delaying means for delaying the output signal for at least two clock cycles and a plurality of third operating means for operating each output signal of the plurality of second delaying means with predetermined pole coefficients more than second pole at least corresponding to the delayed time; and second synthesizing means for outputting the output signal by synthesizing the output signals of the first synthesizing means and the feedback means, wherein the filter circuit has a predetermined transfer function H(Z), the transfer function is $$H(Z) = \frac{a_0 + \sum_{i=1}^{M} a_i' Z^{-i}}{1 + \sum_{i=2}^{N} b_i' Z^{-i}}$$

where $a_0'=a_0$, $a_1'=a_1-a_0 b_1$, $a_2'=-a_1 b_1, \ldots$, and $b_1'=b_1-b_1=0$, $b_2'=b_2-b_1^2$, $b_3'=b_3-b_1 b_2, \ldots$ signifies a particular gain of an operating means, and $Z^{-1}$ signifies a delaying means.

BRIEF DESCRIPTION OF THE DRAWINGS

The above objects and advantages of the present invention will become more apparent by describing in detail a preferred embodiment thereof with reference to the attached drawings in which:

FIGS. 16A–16E are views illustrating the operation timing of the feedback portion shown in FIG. 14.

DETAILED DESCRIPTION OF THE INVENTION

An all-pass filter synthesizing process is described which accelerates a signal process in a digital IIR filter. In this process, however, filter stability and the input/output characteristics of the whole system are not changed by the synthesis result of the filter.

Expression (5) shows a transfer function of an all-pass filter adopted in the present invention, and expression (6-1) shows a synthesis of a transfer function of a general IIR filter circuit described in expression (3) and a transfer function of an all-pass filter described in expression (5).

$$H_3(Z) = \frac{1-b_1Z^{-1}}{1-b_1Z^{-1}} \qquad (5)$$
$$= 1$$

$$H_4(Z) = \frac{\sum_{i=0}^{M} a_i Z^{-i}}{1+\sum_{i=1}^{N} b_i Z^{-i}} \left( \frac{1-b_1Z^{-1}}{1-b_1Z^{-1}} \right) \qquad (6-1)$$

The transfer function $H_1(Z)$ of the general IIR filter described in expression (3) includes first pole coefficient $b_1$, which is an obstacle to high-speed performance.

The value of coefficient $b_1$ of a first pole and zero in the transfer function $H_3(Z)$ of the all-pass filter in expression (5) is congruous with coefficient $b_1$ of the transfer function $H_1(Z)$ of the IIR filter, but the sign is opposite. Also, the transfer function $H_3(Z)$ of expression (5) is reduced to 1, and so the transfer function characteristic of $H_1(Z)$ is not altered by the synthesis of two transfer functions $H_1(Z)$ and $H_3(Z)$.

Thus, if a first pole coefficient $b_1$ of transfer function $H_1(Z)$ of the IIR filter to be accelerated is less than 1, the IIR filter is stable, as is the all-pass filter to be synthesized according to transfer function $H_3(Z)$. Accordingly, the stability condition of a filter after the synthesis can be achieved.

The denominator coefficient of expression (6-1) after the synthesis is expanded as follows.

$$(1-b_1Z^{-1})\left(1+\sum_{i=1}^{N} b_i Z^{-i}\right) = 1+\sum_{i=1}^{N} b_i Z^{-i} - b_1 Z^{-1} -$$
$$b_1 Z^{-1} \sum_{i=1}^{N} b_i Z^{-i}$$
$$= 1+(b_1-b_1)Z^{-1} +$$
$$(b_2-b_1{}^2)Z^{-2} +$$
$$(b_3-b_1b_2)Z^{-3} + \ldots$$

Here, $b_1'=b_1-b_1=0$, $b_2'=b_2-b_1{}^2$, $b_3'=b_3-b_1b_2$, ...

In the expansion of the above expression (6-2), the first pole is eliminated since $b_1-b_1=0$. The nominator coefficient is expanded as follows.

$$(1-b_1Z^{-1})\sum_{i=0}^{M} a_i Z^{-i} = \sum_{i=0}^{M} a_i Z^{-i} - a_1 b_1 \sum_{i=0}^{M} Z^{-(i+1)} \qquad (6-3)$$
$$= a_0 - a_0 b_1 Z^{-1} + a_1 Z^{-1} - a_1 b_1 Z^{-2} + \ldots$$
$$= a_0 + (a_1 - a_0 b_1)Z^{-1} - a_1 b_1 Z^{-2} + \ldots$$

Here, $a_0'=a_0$, $a_1'=a_1-a_0b_1$, $a_2'=-a_1b_1$, ...

Accordingly, $$H_4(Z) = \frac{a_0 + \sum_{i=1}^{M} a_i' Z^{-i}}{1+\sum_{i=2}^{N} b_i' Z^{-i}} \qquad (7)$$

Expression (7) is a form of a general term obtained from expressions (6-2) and (6-3), and when an IIR filter and an all-pass filter are synthesized, not only is a first pole eliminated, but also, the stability of the IIR filter is maintained because the input/output characteristics of a transfer function are not altered.

Figure 9:
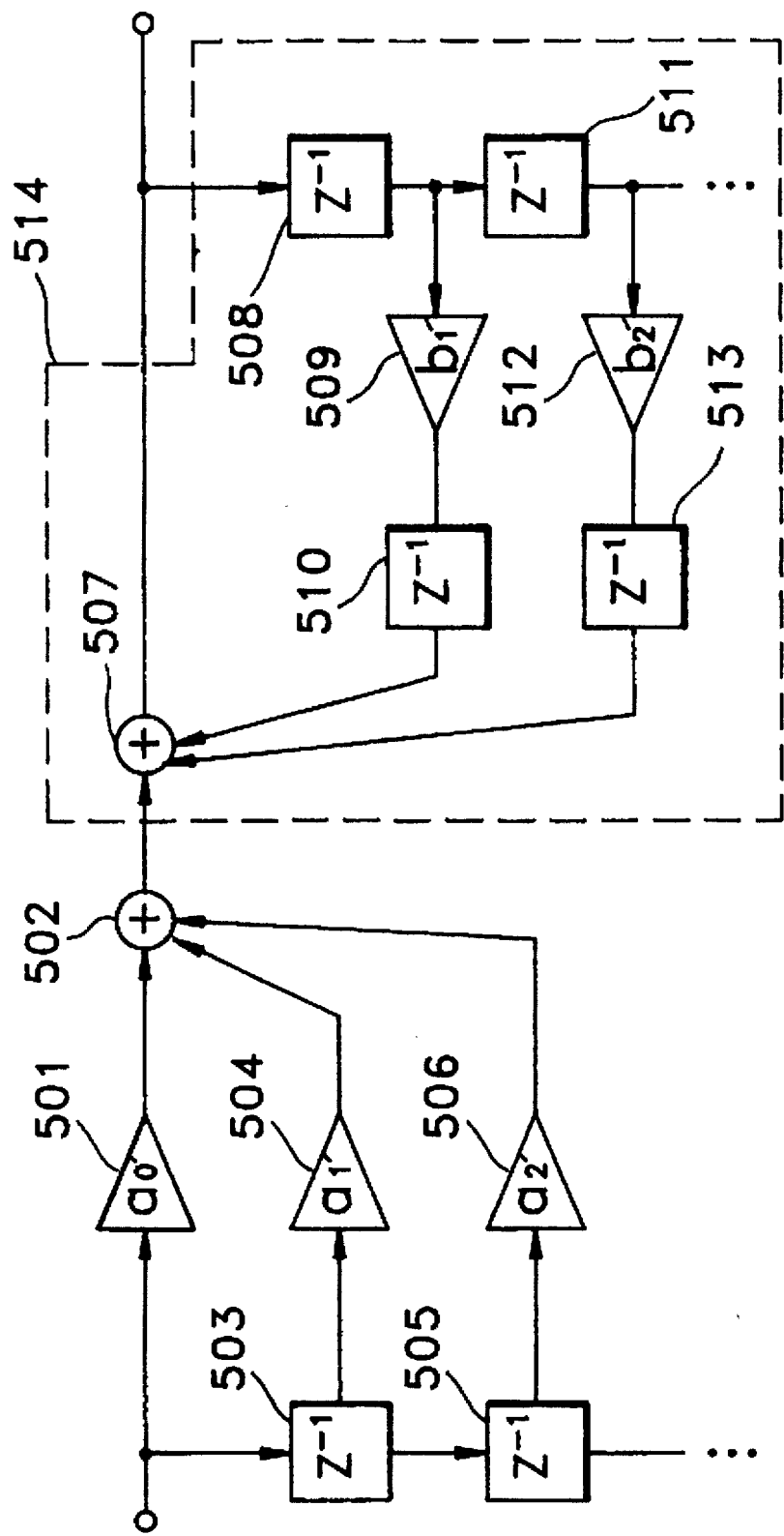
FIG. 9 is a circuit diagram illustrating an embodiment of the digital filter circuit according to the present invention.

The digital IIR filter circuit embodying the transfer function shown in expression (7) is shown in FIG. 9.

As shown in FIG. 9, in a second pole, the calculation of a pole coefficient and the adding operation of the calculated coefficient can be operated at latches 508 and 510, respectively, so as to speed up signal processing. That is, when second pole $b_2'$ is calculated, the output signal of adder 507, which is latched at latch 508, calculates a coefficient of the second pole at amplifier 509, and feeds back to adder 507, being latched again at latch 510.

On the other hand, linearity means that when a particular value X is input and Y is output, the output value corresponding to the input of aX becomes aY. A linear circuit maintains linearity, and a non-linear circuit can be regarded as a case that an input/output value does not maintain linearity.

Figure 10:
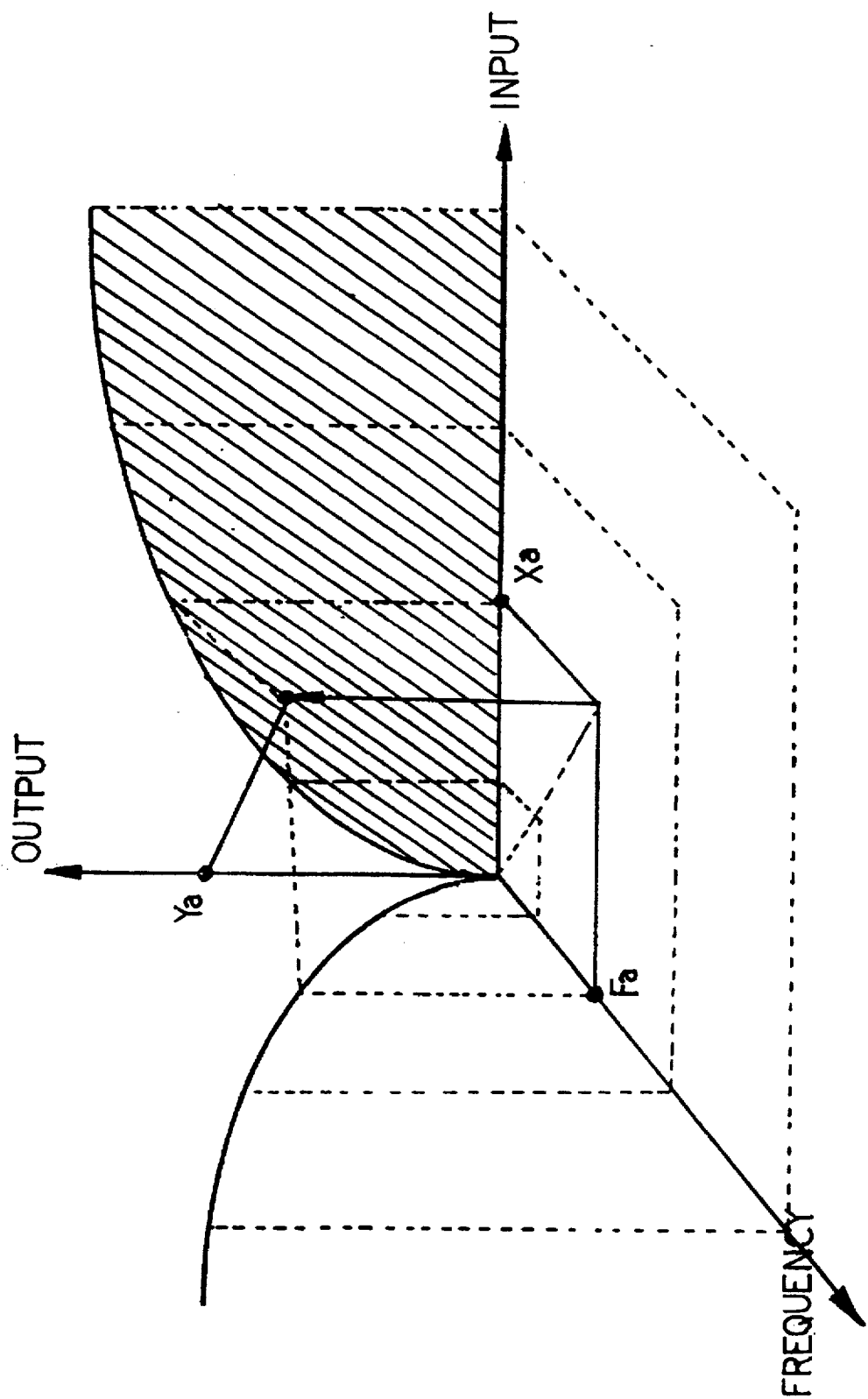
FIG. 10 is a view showing the input/output characteristics of a non-linear filter circuit of the present invention.

FIG. 10 shows the typical input/output characteristics of the non-linear digital filter circuit. Output function $Y_a$ is determined by being associated non-linearly about input frequency $F_a$ and input value $X_a$.

The present invention can be applied not only to a linear IIR filter circuit in which the denominator and numerator coefficient of a transfer function, in expression (3), has a linear coefficient, but also to that which has a non-linear coefficient. Thus, the denominator and numerator coefficient value $b_1$ of the all-pass filter, which is synthesized to have the non-linear characteristic of the digital IIR filter circuit, also has the non-linear characteristic.

Figure 11:
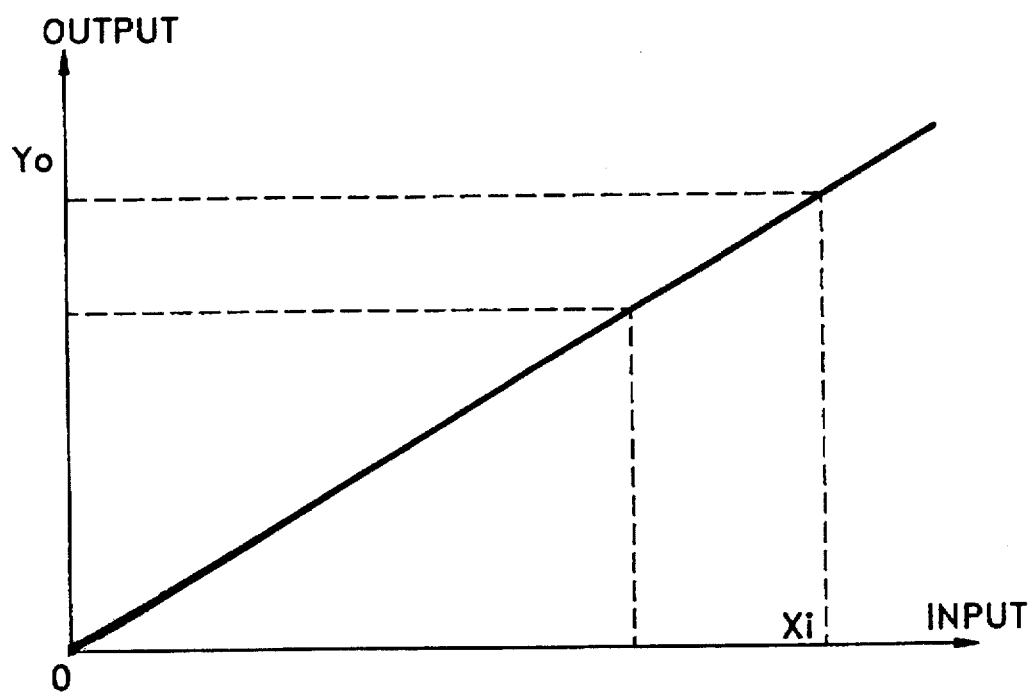
FIG. 11 is a view showing the characteristic of a coefficient of an all-pass filter for a linear IIR filter to which the present invention is applied.
Figure 12:
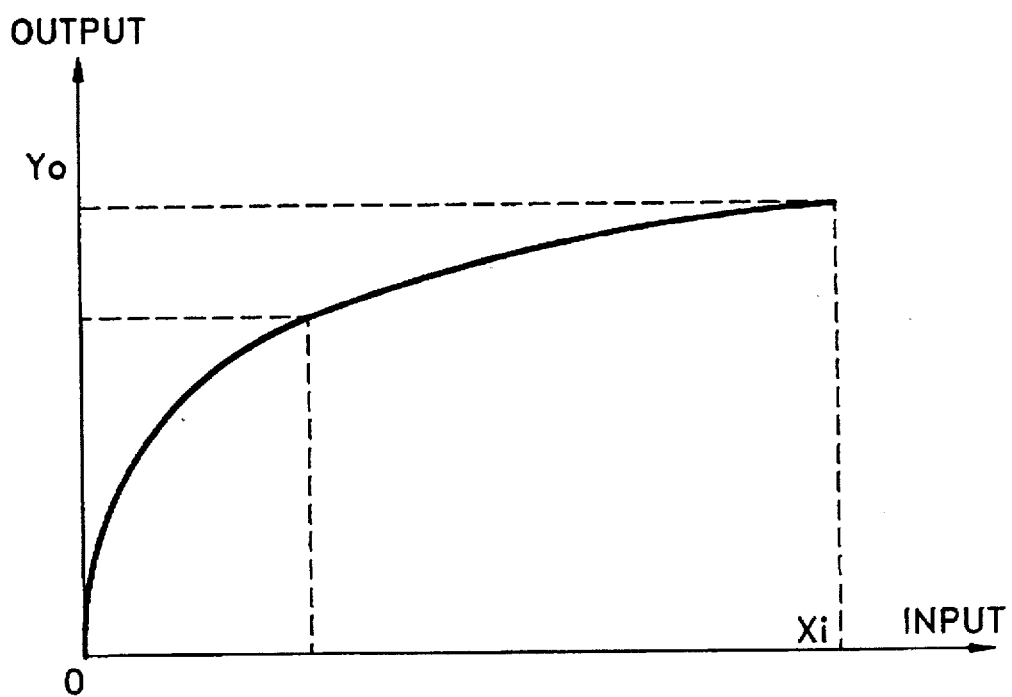
FIG. 12 is a view showing the characteristic of a coefficient of the all-pass filter for the non-linear IIR filter to which the present invention is applied.

FIG. 11 shows the linear characteristic of a coefficient of the all-pass filter for speeding up the signal processing of the linear IIR to which the present invention is applied. FIG. 12 shows the curve characteristic of the all-pass filter coefficient for speeding up the signal process of the non-linear IIR filter circuit to which the present invention is applied.

Namely, in the linear IIR filter, coefficient $b_1$ of the all-pass filter is set to have linear characteristics, and in the non-linear digital IIR filter, efficient $b_1$ of the all-pass filter is set to have the non-linear characteristics.

Referring to FIGS. 12 to 16A–16E, a digital main pre-emphasis circuit to which the present invention is applied, is explained hereinafter.

Two kinds of algorithms are suggested, which are for speeding up the signal processing by eliminating the first pole from the digital main pre-emphasis circuit using the IIR filter.

The first is a method of using the all-pass filter described above.

When the transfer function $H_2(Z)$ of the digital main pre-emphasis circuit is the same as expression (4) and the transfer function $H_3(Z)$ of the all-pass filter is the same as expression (5), the transfer function, after being synthesized by the main pre-emphasis circuit with the all-pass filter, is reconstituted as expression 9.

$$Y(Z) = H_2(Z)H_3(Z)X(Z) \tag{8-1}$$

$$Y(Z) = X(Z)\left(\frac{A(a_0 + a_1 Z^{-1})}{1 + b_1 Z^{-1}}\right)\left(\frac{1 - b_1 Z^{-1}}{1 - b_1 Z^{-1}}\right) \tag{8-2}$$

$$= X(Z)\left(\frac{A[a_0 + (a_1 - a_0 b_1)Z^{-1} - a_1 b_1 Z^{-2}]}{1 - b_1^2 Z^{-2}}\right) \tag{8-3}$$

$$= X(Z)\left(\frac{A(a_0' + a_1' Z^{-1} + a_2' Z^{-2})}{1 + b_1' Z^{-2}}\right) \tag{8-4}$$

and $$H(Z) = \frac{A(a_0' + a_1' Z^{-1} + a_2' Z^{-2})}{1 + b_1' Z^{-2}} \tag{9}$$

Here, $a_0' = a_0$, $a_1' = a_1 - a_0 b_1$, $a_2' = -a_1 b_1$ and $b_1' = -b_1^2$.

Expressions (8-2) and (8-3) result from expression (8-1), and expression (8-4) is the result from replacing each coefficient of expression (8-3). Since each coefficient $a_0$, $a_1$ and $b_1$ of expression (4) is a constant, $a_0'$, $a_1'$, $a_2'$ and $b_1'$ are replaced with constants. Namely, an additional operation is not required to obtain the replaced coefficients. It can be seen that the first pole is eliminated by the all-pass filter from the comparison of expressions (8-4) and (4).

The second algorithm to be discussed is a method of substituting the previous output for a current output.

The transfer function of the IIR filter described in expression (3) can be reconstituted as follows.

$$y(n) = h(n)x(n) \tag{10-1}$$

$$y(n) = x(n)\left(\frac{a_0 + a_1 Z^{-1}}{1 + b_1 Z^{-1}}\right) \tag{10-2}$$

$$y(n)(1 + b_1 Z^{-1}) = x(n)(a_0 + a_1 Z^{-1}) \tag{10-3}$$

$$y(n) = a_0 x(n) + a_1 x(n-1) - b_1 y(n-1) \tag{10-4}$$

$$y(n-1) = a_0 x(n-1) + a_1 x(n-2) - b_1 y(n-2) \tag{11}$$

$$\begin{aligned}y(n) &= a_0 x(n) + a_1 x(n-1) - b_1[a_0 x(n-1) + a_1 x(n-2) - b_1 y(n-2)] \\ &= a_0 x(n) + a_1 x(n-1) - a_0 b_1 x(n-1) - a_1 b_1 x(n-2) + b_1^2 y(n-2)\end{aligned}$$

$$(n)(1 - b_1^2 Z^{-2}) = x(n)[a_0 + (a - a_0 b_1)z^{-1} - z_1 b_1 Z^{-2}]$$

$$y(n) = x(n)\left(\frac{a_0 + (a_1 - a_0 b_1)z^{-1} - a_1 b_1 Z^{-2}}{1 - b_1^2 Z^{-2}}\right) \tag{12}$$

$$H(Z) = \frac{A(a_0' + a_1' Z^{-1} + a_2' Z^{-2})}{1 + b_1' Z^{-2}} \tag{13}$$

Figure 13:
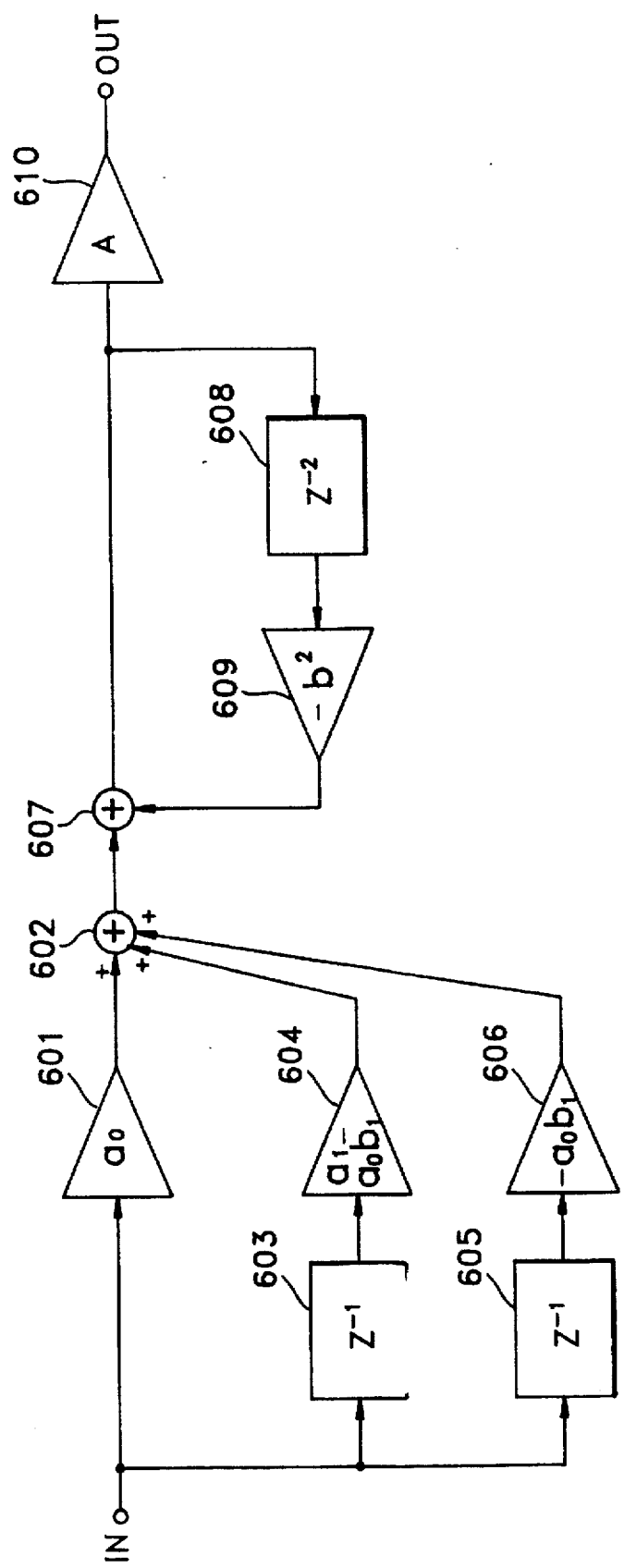
FIG. 13 is a circuit diagram schematically illustrating a digital main pre-emphasis circuit to which the present invention is applied.

Here, $a_0' = a_0$, $a_1' = a_1 - a_0 b_1$, $a_2' = -a_1 b_1$ and $b_1' = -b_1^2$ Accordingly, the circuit constitution by using the transfer function, shown in expressions (9) and (13), which is obtained by the two aforesaid methods, can be embodied in various forms. FIG. 13 is a schematic circuit diagram showing an embodiment of the digital main pre-emphasis circuit using the IIR filter.

Figure 14:
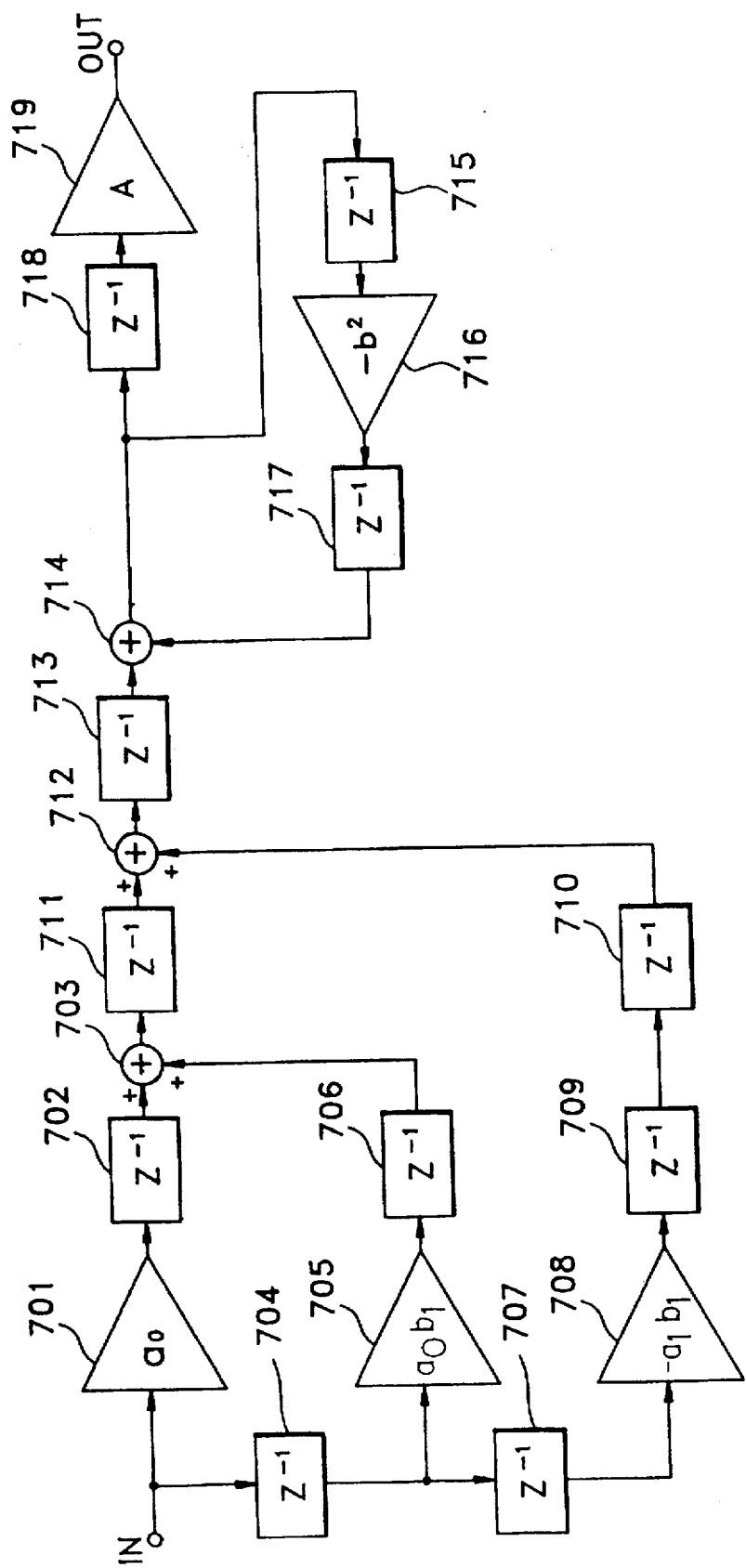
FIG. 14 is a detailed circuit diagram illustrating FIG. 13 in a register transfer logic.

By using FIG. 13, a circuit of a resister transfer level (RTL) design as FIG. 14 can be constituted.

Figure 1:
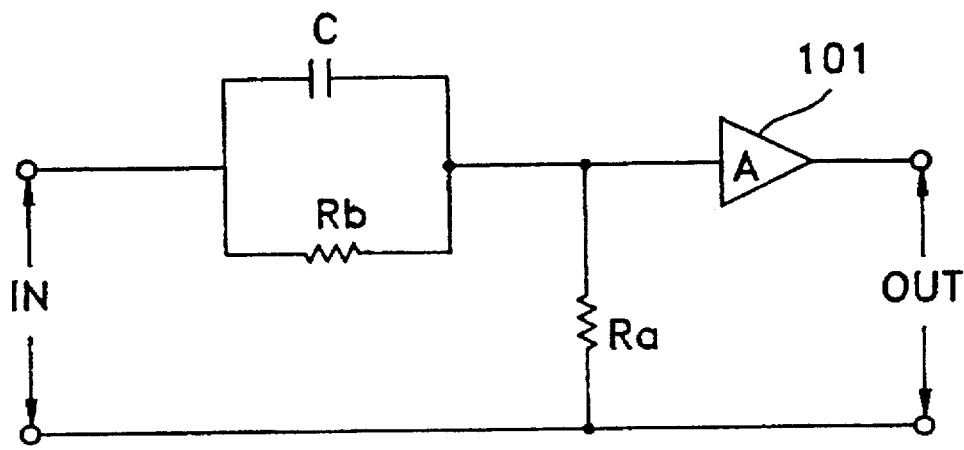
FIG. 1 is a block diagram illustrating a conventional analog main pre-emphasis circuit.
Figure 2:
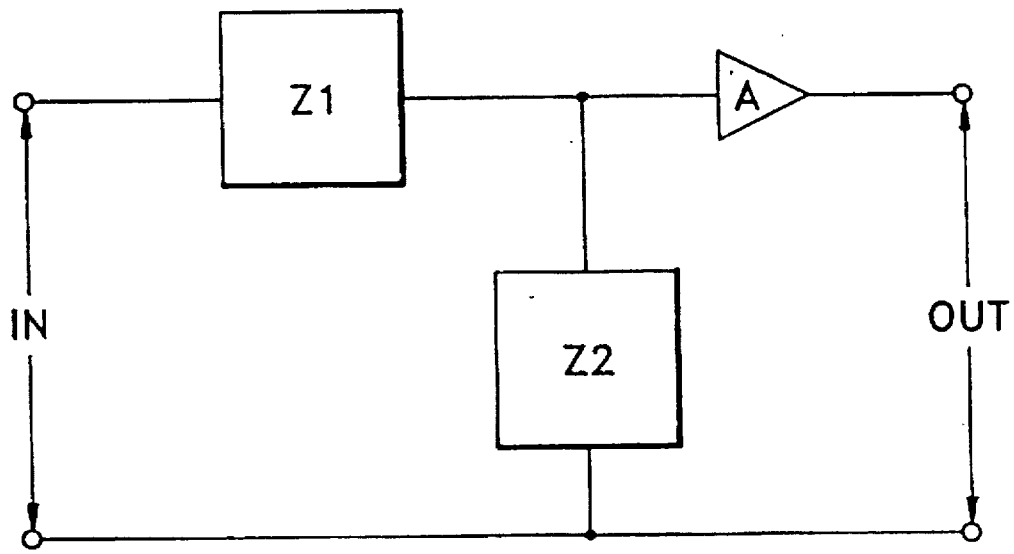
FIG. 2 is a block diagram which is embodied by the transfer function of the circuit shown in FIG. 1.
Figure 3:
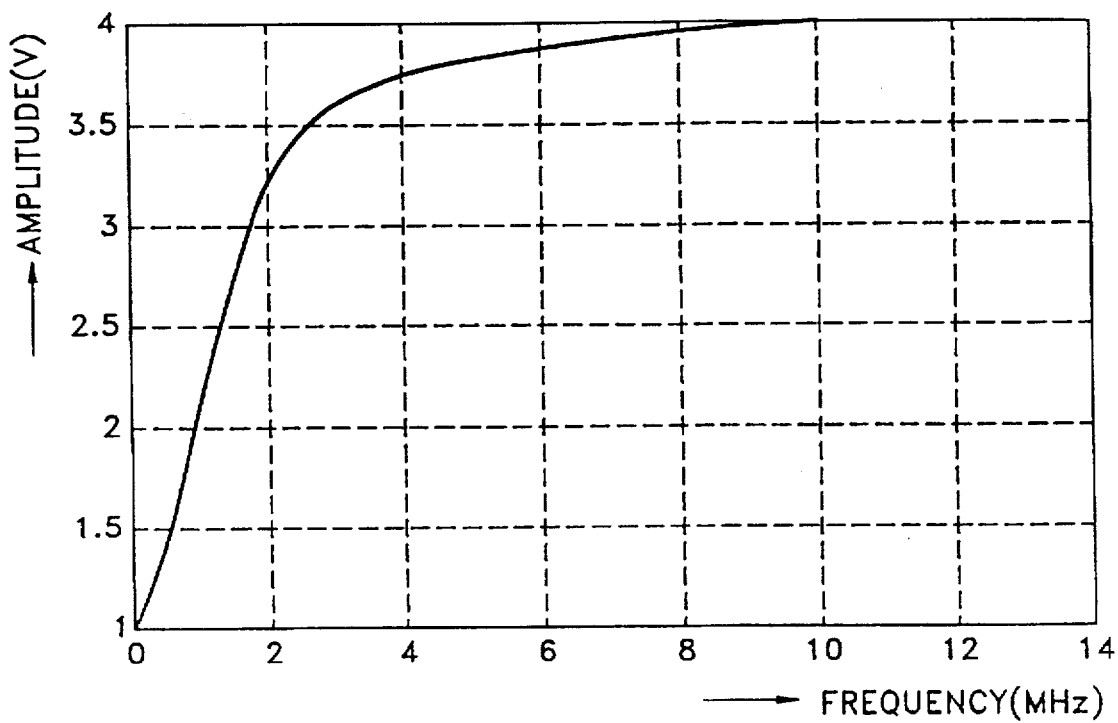
FIG. 3 is a view illustrating the amplitude response characteristic of the transfer function of the circuit shown in FIG. 1.
Figure 4:
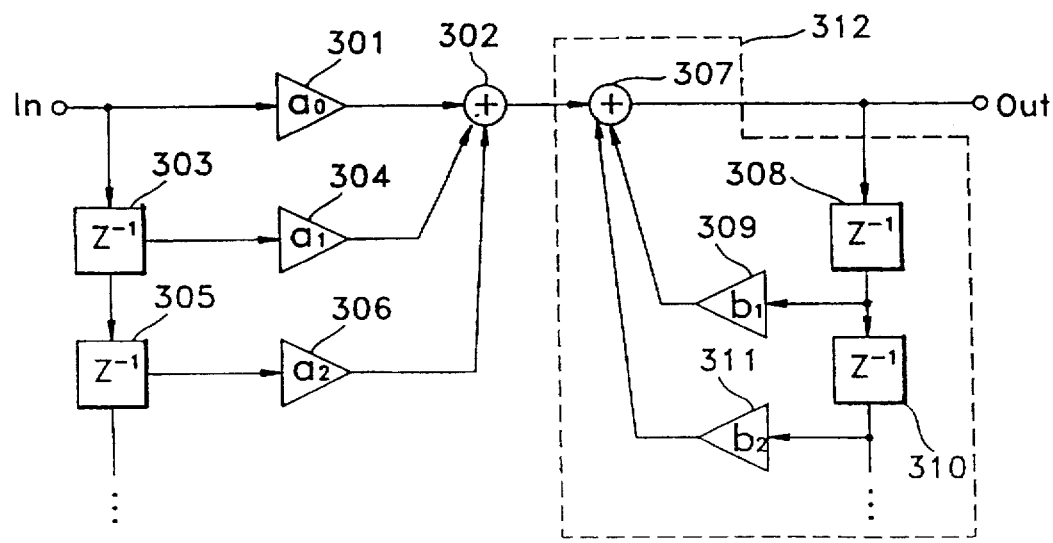
FIG. 4 is a circuit diagram of a general digital IIR filter.
Figure 5:
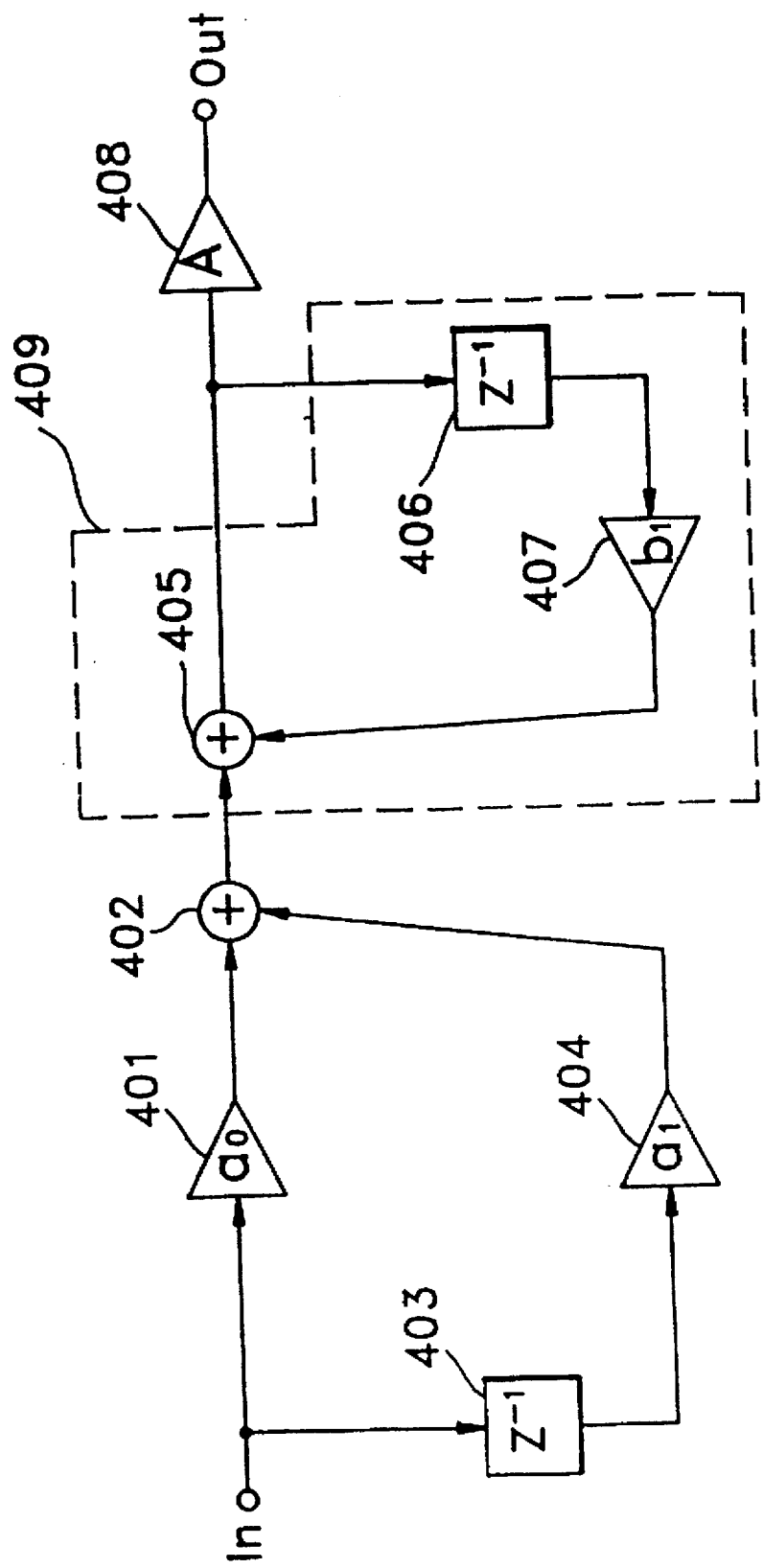
FIG. 5 is a circuit diagram of a conventional digital main pre-emphasis circuit using the IIR filter.
Figure 6:
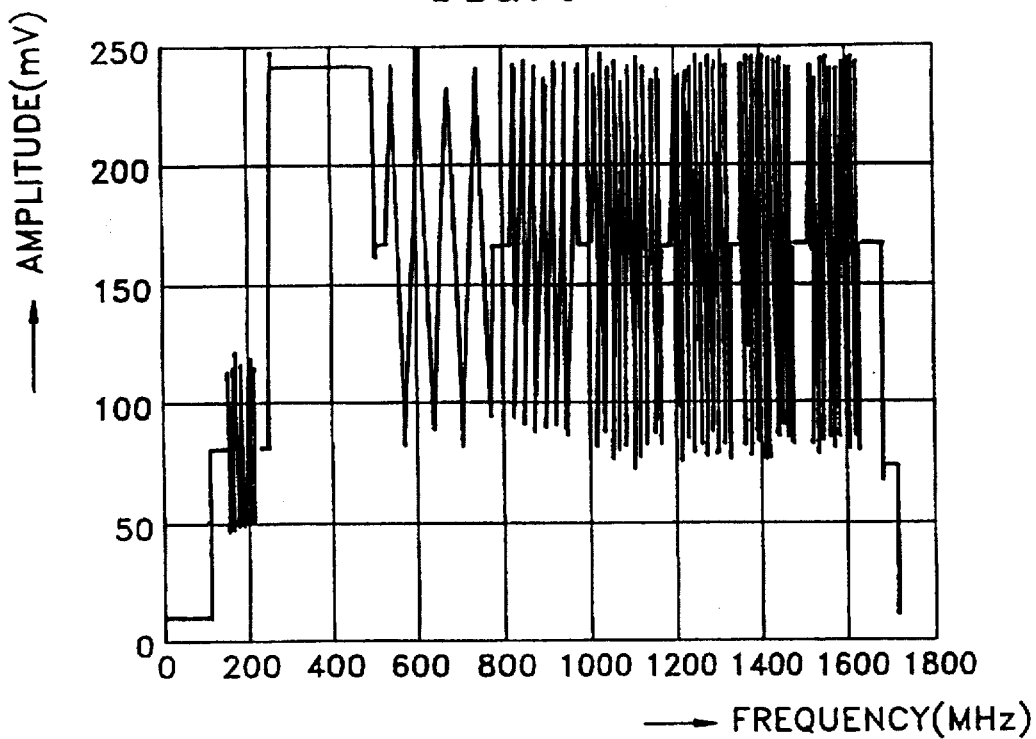
FIG. 6 is a view showing the waveform of the input signal in the circuit shown in FIG. 5.

In FIG. 14, a multi-burst signal (In) input as in FIG. 5 is amplified by amplifier 701 having a gain of $a_0$, and latched at latch 702. Also, the multi-burst signal which is latched at latch 704 is latched again at latch 706 via amplifier 705 having a gain of $a_1 - a_0 b_1$.

The output of latch 704 is latched at latch 707, and latched again at latch 709 via amplifier 708 having a gain of $-a_1 b_1$.

The outputs of each latch 702 and 706 are added together at adder 703 and the summed result is latched at latch 711. The outputs of latches 711 and 710 are added together at adder 712 and the summed result is latched at latch 713.

The output of latch 713 and the output of amplifier 716, which is fed back with a gain of $-b^2$, are added together at adder 714. The summed result is input via latch 718 to amplifier 719 having a gain of A. Also, the output of adder 714 is input to amplifier 716 having a gain of $-b^2$ via latch 715 and, after being amplified, is fed back to adder 714 via latch 717.

Figure 7:
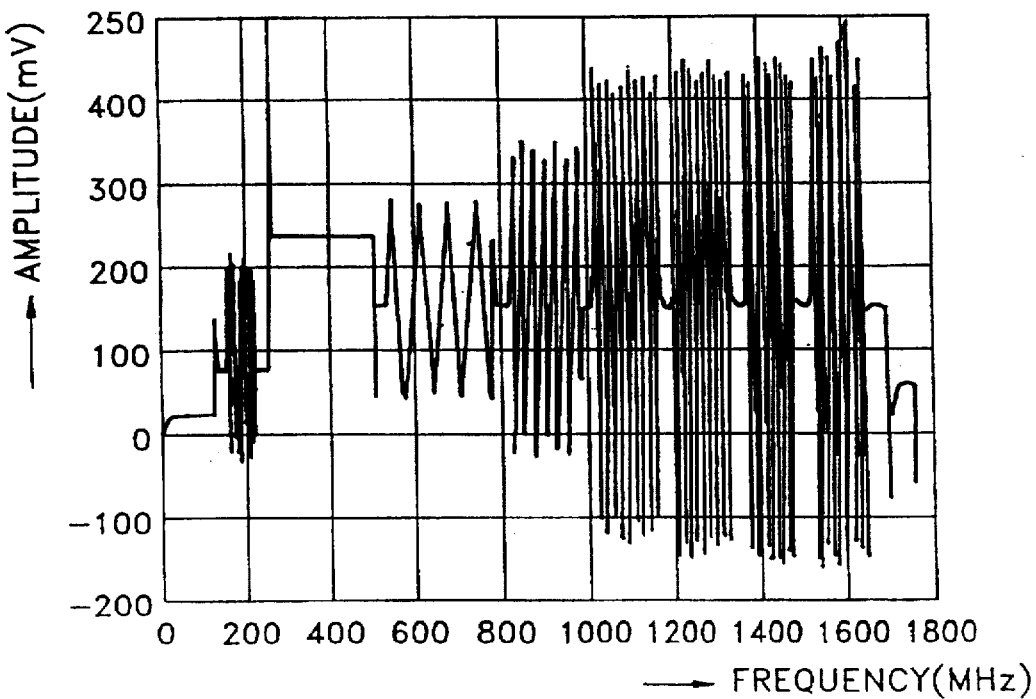
FIG. 7 is a view showing the waveform of the output signal in the circuit shown in FIG. 5.
Figure 8:
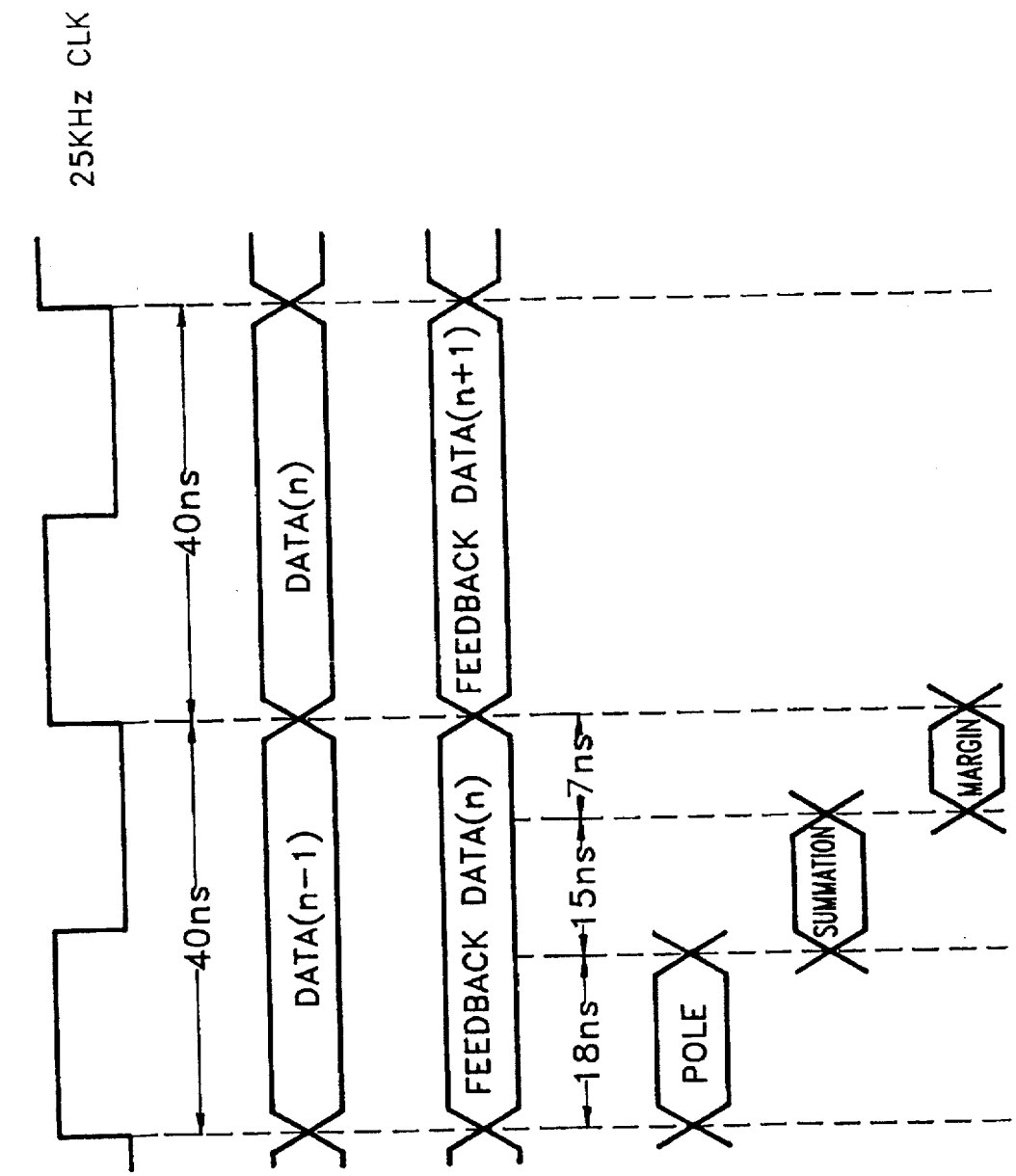
FIGS. 8A–8D are views illustrating the operation timing of the feedback portion of the preemphasis circuit shown in FIG. 5.
Figure 15:
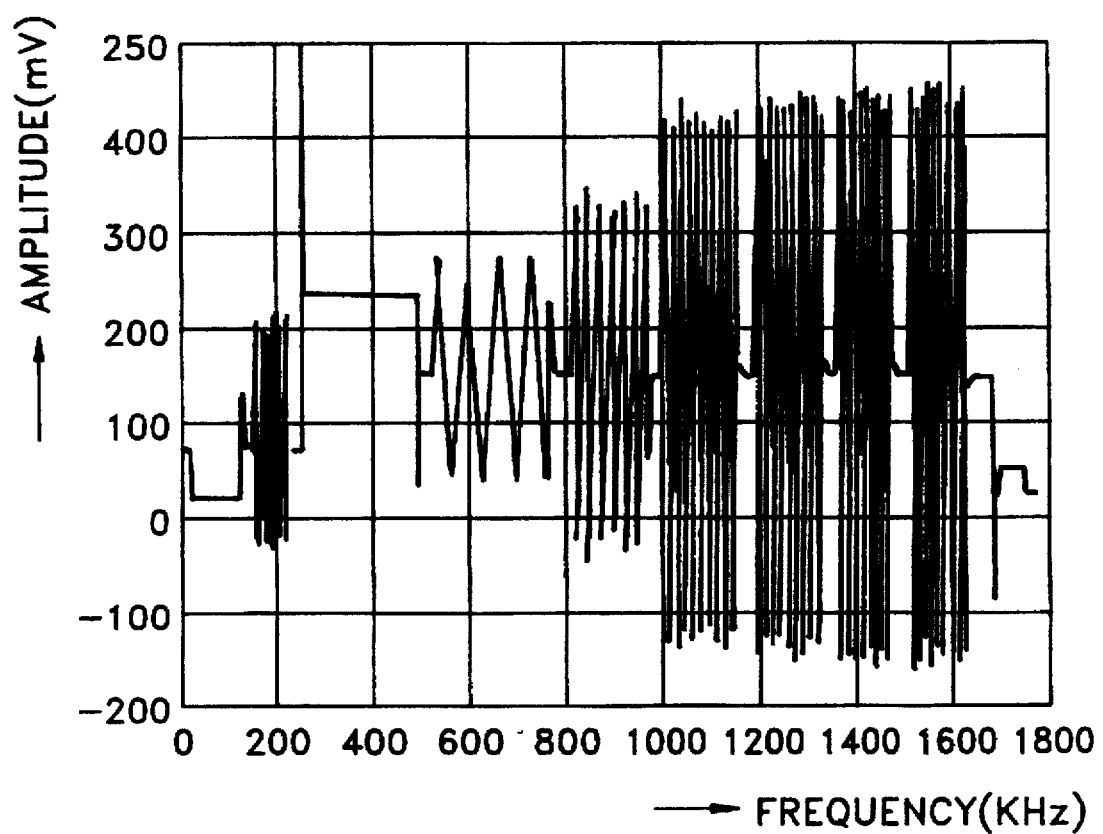
FIG. 15 is a view showing a waveform of an output signal of the circuit shown in FIG. 14.

The signal output from amplifier 719 is shown in FIG. 15. Here, it can be seen that the output characteristics shown in FIG. 15 is congruous with that of FIG. 7. Latches 711, 713 and 718 are positioned after adders 703, 712 and 714 in order to perform accurately the adding operation of the adders. Here, an operational amplifier can be used for the amplifiers having a predetermined gain, and if the operation is complicated, a ROM can replace the operational amplifiers.

Thus, a plurality of signal processing steps (pole coefficient calculation and adding operation) performed in a single clock in a conventional invention, are divided by process. As shown in FIGS. 16A to 16E, the signal processing steps to be performed during the one clock does not exceed one step.

The present invention can be used for an emphasis circuit for frequency modulation and a deemphasis circuit for frequency demodulation. Also, the present invention can be used widely for a digital IIR filter and for an equalizer in the communication field.

As described above, the present invention eliminates the first pole of a digital IIR filter by synthesizing the digital IIR filter with the all-pass filter, so that the signal processing speed can be doubled without changing input/output characteristics.

Also, the present invention performs a single signal processing during one clock cycle by dividing a plurality of signal processes within the clock cycle so that the performance is improved by maintaining the high speed of signal processing without an ultra-high speed element. Also, the present invention has an effect of reducing cost by being embodied in simple hardware.

What is claimed is:

1. A signal processing method of a digital filter circuit having a predetermined transfer function, comprising the steps of:

inputting a signal to a first filter circuit having a predetermined transfer function $H_{11}(Z)$;

inputting an output signal of said first filter circuit to a second filter circuit having a transfer function $H_{12}(Z)$ which has the same amplitude as a first pole coefficient of said transfer function $H_{11}(Z)$ and an opposite sign;

calculating a transfer function $H_{13}(Z)$ from said transfer function $H_{11}(Z)$ of which a first pole is eliminated, by synthesizing said transfer functions $H_{11}(Z)$ and $H_{12}(Z)$; and obtaining the output signal of said second filter circuit through said transfer function $H_{13}(Z)$, wherein, when $b_1=0$, said transfer functions are $$H_{11}(Z) = \frac{\sum_{i=0}^{M} a_i Z^{-i}}{1 + \sum_{i=1}^{N} b_i Z^{-i}}$$

-continued $$H_{12}(Z) = \frac{1 - b_1 Z^{-1}}{1 - b_i Z^{-1}}$$

$$H_{13}(Z) = \frac{a_0 + \sum_{i=1}^{M} a_i' Z^{-i}}{1 + \sum_{i=2}^{N} b_i' Z^{-i}}$$

where $a_i'$ is determined by expanding an expression:

$$\sum_{i=0}^{M} a_i Z^{-i} - a_i b_1 \sum_{i=0}^{M} Z^{-(i+1)},$$

so that $a_0'=a_0$, $a_1'=a_1-a_0 b_1$, $a_2'=a_1 b_1$ ... ;

and $b_i'$ is determined by expanding an expression:

$$1 + \sum_{i=1}^{N} b_i Z^{-i} - b_1 Z^{-1} - b_1 Z^{-1} \sum_{i=1}^{N} b_i Z^{-i}$$

so that $b_1'=b_1-b_1=0$, $b_2'=b_2-b_1{}^2$, $b_3'=b_3-b_1 b_2$, ... ;

i represents a respective pole or zero, $a_i$ represents a respective zero coefficient, $b_i$ represents a respective pole coefficient, M represents a highest order zero, N represents a highest order pole, and $Z^i$ represents a respective delay time.

2. A signal processing method of a digital filter circuit described in claim 1, wherein denominator and numerator coefficients of transfer function $H_{12}(Z)$ of said second filter circuit are set to produce a linear characteristic, and then applied to a linear filter circuit.

3. A signal processing method of a digital filter circuit described in claim 1, wherein denominator and numerator coefficients of transfer function $H_{12}(Z)$ of said second filter circuit are set to produce a non-linear characteristic, and then applied to a non-linear filter circuit.

4. A signal processing method of a digital filter circuit, in which a signal is processed through a digital main pre-emphasis circuit having a predetermined transfer function, comprising the steps of:

inputting a signal to a first filter circuit having a predetermined transfer function $H_{21}(Z)$;

inputting an output signal of said first filter circuit to a second filter circuit having a transfer function $H_{22}(Z)$ which has the same amplitude as a first pole coefficient of said transfer function $H_{21}(Z)$ and an opposite sign;

calculating a transfer function $H_{23}(Z)$ from said transfer function $H_{21}(Z)$ of which a first pole is eliminated, by synthesizing said transfer functions $H_{21}(Z)$ and $H_{22}(Z)$; and obtaining an output signal of said second filter circuit through said transfer function $H_{23}(Z)$, wherein, when $b_1 \neq 0$, said transfer functions are $$H_{21}(Z) = \frac{a_0 + a_i Z^{-1}}{1 + b_i Z^{-1}}$$

$$H_{22}(Z) = \frac{1 - b_1 Z^{-1}}{1 - b_1 Z^{-1}}$$

$$H_{23}(Z) = \frac{a_0 + (a_1 - a_0 b_1)Z^{-1} - a_1 b_1 Z^{-2}}{1 - b_1{}^2 Z^{-2}}$$

$$= \frac{a_0' + a_1' Z^{-1} + a_2' Z^{-2}}{1 + b_1' Z^{-2}}$$

where $a_0'=a_0$, $a_1'=a_1-a_0 b_1$, $a_2'=a_1 b_1$, $b_1'=-b_2'$;
a represents a respective zero coefficient, b represents a respective pole coefficient, and Z represents a respective delay time.

5. A signal processing method of a digital main pre-emphasis circuit, in which a signal is processed through a digital main pre-emphasis circuit having a predetermined transfer function, comprising the steps of:

producing output signal y(n) by inputting input signal x(n) to a filter circuit having a predetermined transfer function $H_{31}(Z)$;

producing delay signal y(n−1) by delaying said output signal;

calculating transfer function $H_{32}(Z)$ from said transfer function $H_{31}(Z)$ where a first pole is eliminated by substituting said delay signal y(n−1) for said output signal y(n); and processing said input signal by a filter circuit having said transfer function $H_{32}(Z)$, wherein, when $b_1 \neq 0$, the conditions are $$H_{31}(Z) = \frac{a_0 + a_1 Z^{-1}}{1 + b_1 Z^{-1}}$$

$$y(n) = a_0 x(n) + a_1 x(n-1) - b_1 y(n-1)$$
$$y(n-1) = a_0 x(n-1) + a_1 x(n-2) - b_1 y(n-2)$$

$$H_{32}(Z) = \frac{a_0 + (a_1 - a_0 b_1)Z^{-1} - a_1 b_1 Z^{-2}}{1 - b_1{}^2 Z^{-2}} = \frac{a_0' + a_1' Z^{-1} + a_2' Z^{-2}}{1 + b_1' Z^{-2}}$$

where $a_0'=a_0$, $a_1'=a_1-a_0 b_1$, $a_2'=-a_1 b$, $b_1'=-b_1{}^2$ and;
a represents a respective zero coefficient, b represents a respective pole coefficient, and Z represents a respective delay time.

6. A digital filter circuit comprising:

first operating means for operating an input signal with a predetermined zero coefficient and generating a first output signal;

a plurality of first delaying means for delaying said input signal for more than one clock cycle;

a plurality of second operating means for operating each output signal of said plurality of first delaying means with predetermined zero coefficients of a higher order than a first zero coefficient corresponding to a delay time of said plurality of first delaying means and each of said plurality of second operating means generating an output signal;

a first synthesizing means for synthesizing the first output signal of said first operating means and each output signal of said plurality of second operating means and generating a third output signal;

feedback means including a plurality of second delaying means for delaying the third output signal for at least two clock cycles and a plurality of third operating means for operating each output signal of said plurality of second delaying means with a respective predetermined pole coefficient relating to a pole of a higher order than two corresponding to the delayed time; and second synthesizing means for outputting a fourth output signal by synthesizing the output signals of said first synthesizing means and said feedback means, wherein said filter circuit has a predetermined transfer function (H(Z)), wherein, said transfer function is $$H(Z) = \frac{a_0 + \sum_{i=1}^{M} a_i'Z^{-i}}{1 + \sum_{i=2}^{N} b_i'Z^{-i}}$$

where $a_0'=a_0$, signify a gain of said first operating means, $a_1'$, $a_2'$, ..., signify gains of respective ones of said plurality of said second operating means, where $a_i'$ is determined by expanding an expression:

$$\sum_{i=0}^{M} a_i Z^{-i} - a_i b_1 \sum_{i=0}^{M} Z^{-(i+1)}$$

so that $a_1'=a_1-a_0b_1$, $a_2'=-a_1b_1$, ..., $b_1'$, $b_2'$, $b_3'$, ... signify gains of respective ones of said plurality of third operating means, where $b_i'$ is determined by expanding an expression:

$$1 + \sum_{i=1}^{N} b_i Z^{-1} - b_1 Z^{-1} - b_1 Z^{-1} \sum_{i=1}^{N} b_i Z^{-i}$$

so that $b_1'=(b_1-b_1)=0$, $b_2'=(b_2-b_1^2)$, $b_3'=(b_3-b_1b_2)$, ..., and $Z^{-1}$ signifies a delaying means, $Z^{-i}$ represents a respective delay means, i represents a respective pole or zero, $a_i$ represents a respective zero coefficient, $b_i$ represents a respective pole coefficient, M represents a highest order zero, and N represents a highest order pole.

7. A digital main pre-emphasis circuit comprising:

first operating means for operating an input signal with a predetermined zero coefficient;

second operating means for operating the input signal with a first zero coefficient for a clock cycle;

third operating means for operating said input signal with a second zero coefficient for two clock cycles;

first synthesizing means for synthesizing the outputs of said first to third operating means;

feedback means for feeding back after operating the output of said first synthesizing means with second pole coefficient for two clock cycles; and second synthesizing means for feeding back to said feedback means, by synthesizing the outputs of said first synthesizing means and said feedback means, and at the same time outputting the synthesized output, wherein said filter circuit has a predetermined transfer function H'(Z), and said transfer function is $$H'(Z) = \frac{a_0 + (a_1 - a_0b_1)Z^{-1} - a_1b_1Z^{-2}}{1 - b_1^2Z^{-2}} = \frac{a_0' + a_1'Z^{-1} + a_2'Z^{-2}}{1 + b_1'Z^{-2}}$$

where $a_0'=a_0$, $a_1'=a_1-a_0b_1$, $a_2'=-a_1b$, $b_1'=-b_1^2$ signify a particular gain of an operating means and $Z^{-1}$ signifies a delaying means, a represents a respective zero coefficient, and b represent a respective pole coefficient.

8. A digital main pre-emphasis circuit described in claim 7, wherein said feedback means comprises a first delaying means for delaying the output of said second synthesizing means, an amplifying means for amplifying an output of said first delaying means with a gain corresponding to a second pole coefficient, and a second delaying means for delaying an output of said amplifying means and being fed back to said second synthesizing means.

9. A digital main pre-emphasis circuit described in claim 8, wherein said amplifying means is an operation amplifier.

10. A digital main pre-emphasis circuit described in claim 8, wherein said amplifying means is a ROM.

11. A digital main pre-emphasis circuit described in claim 7, wherein each of said first to third operating means comprises an operation amplifier and a latch.

12. A digital main pre-emphasis circuit described in claim 7, wherein each of said first to third operating means comprises a ROM and a latch.

* * * * *